United States Patent
Guha et al.

(10) Patent No.: US 11,782,096 B2
(45) Date of Patent: Oct. 10, 2023

(54) METHOD AND SYSTEM FOR IMPROVING STATE OF HEALTH OF RECHARGEABLE BATTERIES

(71) Applicant: Samsung Electronics Co., Ltd., Suwon-si (KR)

(72) Inventors: Arijit Guha, Bangalore (IN); Subramanian Swernath Brahmadathan, Bangalore (IN); Krishnan S Hariharan, Bangalore (IN); Piyush Tagade, Bangalore (IN); Rajkumar Subhash Patil, Bangalore (IN); Jeonghoon Jo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/169,402

(22) Filed: Feb. 5, 2021

(65) Prior Publication Data

US 2021/0247460 A1  Aug. 12, 2021

(30) Foreign Application Priority Data

Feb. 7, 2020 (IN) .............................. 202041005492

(51) Int. Cl.
*G01R 31/392* (2019.01)
*H01M 10/42* (2006.01)
(Continued)

(52) U.S. Cl.
CPC ......... *G01R 31/392* (2019.01); *G01R 31/374* (2019.01); *G01R 31/3842* (2019.01); *H01M 10/425* (2013.01); *H01M 2010/4271* (2013.01)

(58) Field of Classification Search
CPC ................ G01R 31/392; G01R 31/374; G01R 31/3842; G01R 31/367; H01M 10/425;
(Continued)

(56) References Cited

U.S. PATENT DOCUMENTS

| 11,101,679 B2 | 8/2021 | Battle et al. |
| 2008/0208778 A1 | 8/2008 | Sayyar-Rodsar et al. |

(Continued)

FOREIGN PATENT DOCUMENTS

| JP | 2008-522152 A | 6/2008 |
| JP | 5533482 B2 | 6/2014 |

(Continued)

OTHER PUBLICATIONS

V. Vaideeswaran et al. "Battery Management Systems for Electric Vehicles using Lithium Ion Batteries", IEEE, Innovations in Power and Advanced Computing Technologies (i-PACT), Mar. 1, 2019. (Year: 2019).*

(Continued)

*Primary Examiner* — Catherine T. Rastovski
*Assistant Examiner* — Lal C Mang (57) ABSTRACT

The present disclosure provides a method and a system for improving the state of health (SoH) of rechargeable batteries. The method comprises receiving a plurality of battery parameters during charging of a battery and estimating model parameters of the battery using a mathematical model. The method also comprises comparing the estimated model parameters of the battery and the received battery parameters to determine degradation parameters of the battery in real-time, determining new charging current profile of the battery based on the degradation parameters of the battery, and applying the determined new charging current profile to the battery for improving the SoH of the battery.

18 Claims, 4 Drawing Sheets

(51) Int. Cl.
*G01R 31/374* (2019.01)
*G01R 31/3842* (2019.01)

(58) Field of Classification Search
CPC ........... H01M 10/44; H01M 2010/4271; H02J 7/005; Y02E 60/10
See application file for complete search history.

(56) References Cited

U.S. PATENT DOCUMENTS

| | | | |
|---|---|---|---|
| 2011/0060539 | A1 | 3/2011 | Sciarrotta et al. |
| 2013/0229156 | A1* | 9/2013 | Brandon ............... H02J 7/0065 320/136 |
| 2014/0077769 | A1 | 3/2014 | Maleki et al. |
| 2014/0272653 | A1* | 9/2014 | Chaturvedi ....... H01M 8/04537 |
| 2014/0303915 | A1* | 10/2014 | Jo ...................... G01R 31/3648 702/63 |
| 2015/0349385 | A1 | 12/2015 | Hu et al. |
| 2016/0052505 | A1* | 2/2016 | Zhou ..................... B60W 20/10 |
| 2016/0209472 | A1* | 7/2016 | Chow ................ G01R 31/3648 |
| 2018/0076633 | A1* | 3/2018 | Fujita ...................... H02J 7/007 |
| 2018/0120385 | A1* | 5/2018 | Choi .................. G01R 31/3679 |
| 2018/0299511 | A1* | 10/2018 | Kim ................... G01R 31/3679 |
| 2018/0301922 | A1 | 10/2018 | Battle et al. |

FOREIGN PATENT DOCUMENTS

| | | |
|---|---|---|
| KR | 10-2007-0074621 A | 7/2007 |
| KR | 10-2015-0072409 A | 6/2015 |

OTHER PUBLICATIONS

Examination report dated Sep. 3, 2021, in connection with Indian Application No. 202041005492, 6 pages.
Chao Hu et al., "A multiscale framework with extended Kalman filter for lithium-ion battery SOC and capacity estimation". Applied Energy, Sep. 15, 2011, 12 pages.
International Search Report of the International Searching Authority in connection with International Application No. PCT/KR2021/001077 dated Apr. 29, 2021, 3 pages.

* cited by examiner

METHOD AND SYSTEM FOR IMPROVING STATE OF HEALTH OF RECHARGEABLE BATTERIES

CROSS-REFERENCE TO RELATED APPLICATION

This application is based on and claims priority under 35 U.S.C. § 119 to Indian Patent Application No. 202041005492 filed on Feb. 7, 2020 in the Indian Patent Office, the disclosure of which is incorporated by reference herein in its entirety.

1. FIELD

The present subject matter is related in general to the field of batteries, more particularly, but not exclusively to a method and a system for improving State of Health (SoH) of rechargeable batteries.

2. DESCRIPTION OF RELATED ART

With advancements in device technology, rechargeable batteries driving device operations have equally undergone developments. The performance of rechargeable batteries is very much dependent on charging pattern and the extent of its useable lifetime. Charging pattern greatly affects battery SoH due to subsequent aging cycles throughout its lifetime. Usually, during a constant current phase of charging, the degradation due to accumulation of Solid Electrolyte Interphase (SEI) film/layer resistance growth is comparatively more significant as compared to the SEI film/layer resistance growth during a constant voltage phase of charging. The parameters constituting the constant current charging profile are generally assumed to be constant throughout the lifetime of the battery, but may not be correct, and such assumptions might accelerate the degradation mechanisms within the battery as time progresses. Therefore, the parameters need to be updated periodically to generate an optimal charging current profile to minimize the degradation and maximize the deliverable capacity.

The information disclosed in this background of the disclosure section is only for enhancement of understanding of the general background of this disclosure.

SUMMARY

In an embodiment, the present disclosure may relate to a method of improving State of Health (SoH) of rechargeable batteries. The method includes receiving a plurality of battery parameters during charging of a battery, estimating model parameters of the battery using a mathematical model, comparing the estimated model parameters of the battery and the received battery parameters to determine degradation parameters of the battery in real time, determining new charging current profile of the battery based on the degradation parameters of the battery and applying the determined new charging current profile to the battery for improving SoH of the battery.

In an embodiment, the present disclosure may relate to a battery management system for improving SoH of rechargeable batteries. The system may include a processor and a memory communicatively coupled to the processor, wherein the memory stores processor-executable instructions, which on execution, may cause the processor to receive a plurality of battery parameters during charging of a battery, estimate model parameters of the battery using a mathematical model, compare the estimated model parameters of the battery and the received battery parameters to determine degradation parameters of the battery in real time, determine new charging current profile of the battery based on the degradation parameters of the battery, and apply the determined new charging current profile to the battery for improving SoH of the battery.

The foregoing summary is for illustrative purposes and is not intended to be in any way limiting. In addition to the illustrative aspects, embodiments, and features described above, further aspects, embodiments, and features will become apparent by reference to the drawings and the following detailed description.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiment thereof has been shown by way of example in the drawings and will be described in detail below. It should be understood, however that it is not intended to limit the disclosure to the particular forms disclosed, but on the contrary, the disclosure is to cover all modifications, equivalents, and alternatives falling within the scope of the disclosure.

The terms "comprises", "comprising", or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or method.

In the following detailed description of the embodiments of the disclosure, reference is made to the accompanying drawings that form a part hereof, and in which are shown by way of illustration specific embodiments in which the disclosure may be practiced. These embodiments are described in sufficient detail to enable those skilled in the art to practice the disclosure, and it is to be understood that other embodiments may be utilized and that changes may be made without departing from the scope of the present disclosure. The following description is, therefore, not to be taken in a limiting sense.

Embodiments of the present disclosure relate to a method, a device and a system for improving State of Health (SoH) of rechargeable batteries. In the present disclosure, battery ageing dynamics comprising charge current profile has been considered for improving the SoH of rechargeable batteries such as lithium-ion batteries. One of the objectives is to generate an optimal charge current profile during constant current phase of charging to reduce the level of degradation, thereby, increasing the capacity and enhance the lifetime of rechargeable batteries. Firstly, charging current profile parameters effecting the degradation along with the resistance of the SEI layer of a battery are estimated based on an Extended Kalman Filtering (EKF) framework. Thereafter, the estimated parameters are used to configure the charging current profile by minimizing battery capacity loss using a nonlinear constraint optimization algorithm. The current profile configured based on the estimated parameters offers significant improvement over the constant current charging profile in terms of increased battery capacity by minimizing the battery capacity loss. As a result, there is a significant enhancement of the battery lifetime. This can be beneficial for various applications ranging from portable electronic devices to safety critical systems such as Electric Vehicles (EVs), aerospace applications, etc. where battery safety and reliability is of prime importance.

The SoH is a figure of merit that refers to the condition of a battery in comparison to its ideal conditions.

The SEI layer refers to a solid layer that forms at an interface of a liquid electrolyte and electrodes that are present within the rechargeable battery. This solid layer formation is due to decomposition of the liquid electrolyte due to repeated battery charging and discharging cycles.

The battery capacity loss refers to loss or decrease in an amount of charge a rechargeable battery can deliver at a rated voltage. This loss may occur with the usage of rechargeable battery.

Figure 1:
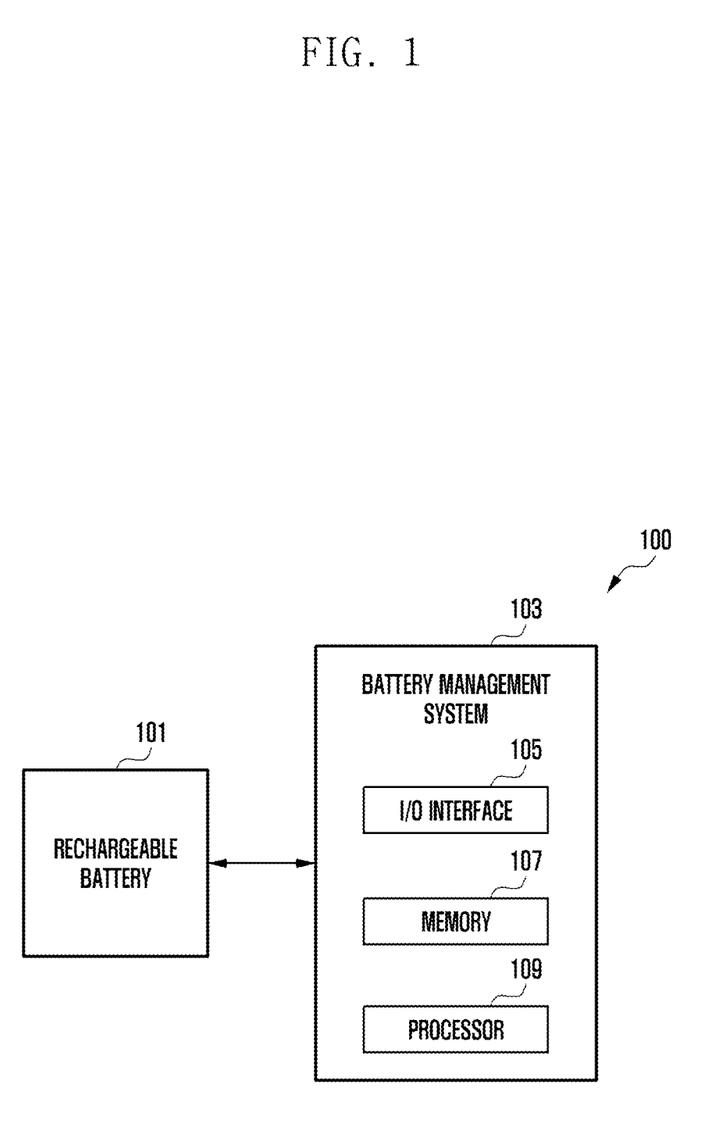
FIG. 1 illustrates an exemplary environment for improving the State of Health of rechargeable batteries in accordance with certain embodiments of the present disclosure.

FIG. 1 illustrates an exemplary environment for improving SoH of rechargeable batteries in accordance with some embodiments of the present disclosure.

As shown in the FIG. 1, the environment 100 includes a rechargeable battery 101 and a battery management system 103. The rechargeable battery 101 (also, referred as a battery) may be a single battery or a plurality of batteries. The rechargeable battery 101 may include, but is not to be limited to, nickel cadmium battery, nickel-metal hydride battery, lead acid battery, lithium ion battery, and lithium ion polymer battery. In an embodiment, the rechargeable battery 101 may be connected to the battery management system 103 in a wired manner. The battery management system 103 may be included with the rechargeable battery 101 within a device (not shown in FIG. 1) or the battery management system 103 may be present external to the device.

In the embodiment, the battery management system 103 may determine and apply new charging current profile to the rechargeable battery 101. The battery management system 103 may include an Input/Output (I/O) interface 105, a memory 107 and a processor 109. The I/O interface 105 may be configured to receive a plurality of battery parameters from the rechargeable battery 101 during charging of the rechargeable battery 101. Analogously, the I/O interface 105 may be configured to apply a new charging current profile to the rechargeable battery 101 for improving SoH of the rechargeable battery 101. The I/O interface 105 may employ wired communication protocol s/methods.

The plurality of battery parameters from the rechargeable battery 101 received by the I/O interface 105 may be stored in the memory 107. The memory 113 may be communicatively coupled to the processor 115 of the battery management system 103. The memory 107 may, also, store processor instructions which may cause the processor 109 to execute the instructions for improving SoH of the rechargeable battery 101. The memory 107 may include, without limitation, memory drives, removable disc drives, etc. The memory drives may further include a drum, magnetic disc drive, magneto-optical drive, optical drive, Redundant Array of Independent Discs (RAID), solid-state memory devices, solid-state drives, etc.

The processor 115 may include at least one data processor for improving SoH of the rechargeable battery 101. The processor 115 may include specialized processing units such as integrated system (bus) controllers, memory management control units, floating point units, graphics processing units, digital signal processing units, etc.

Figure 2:
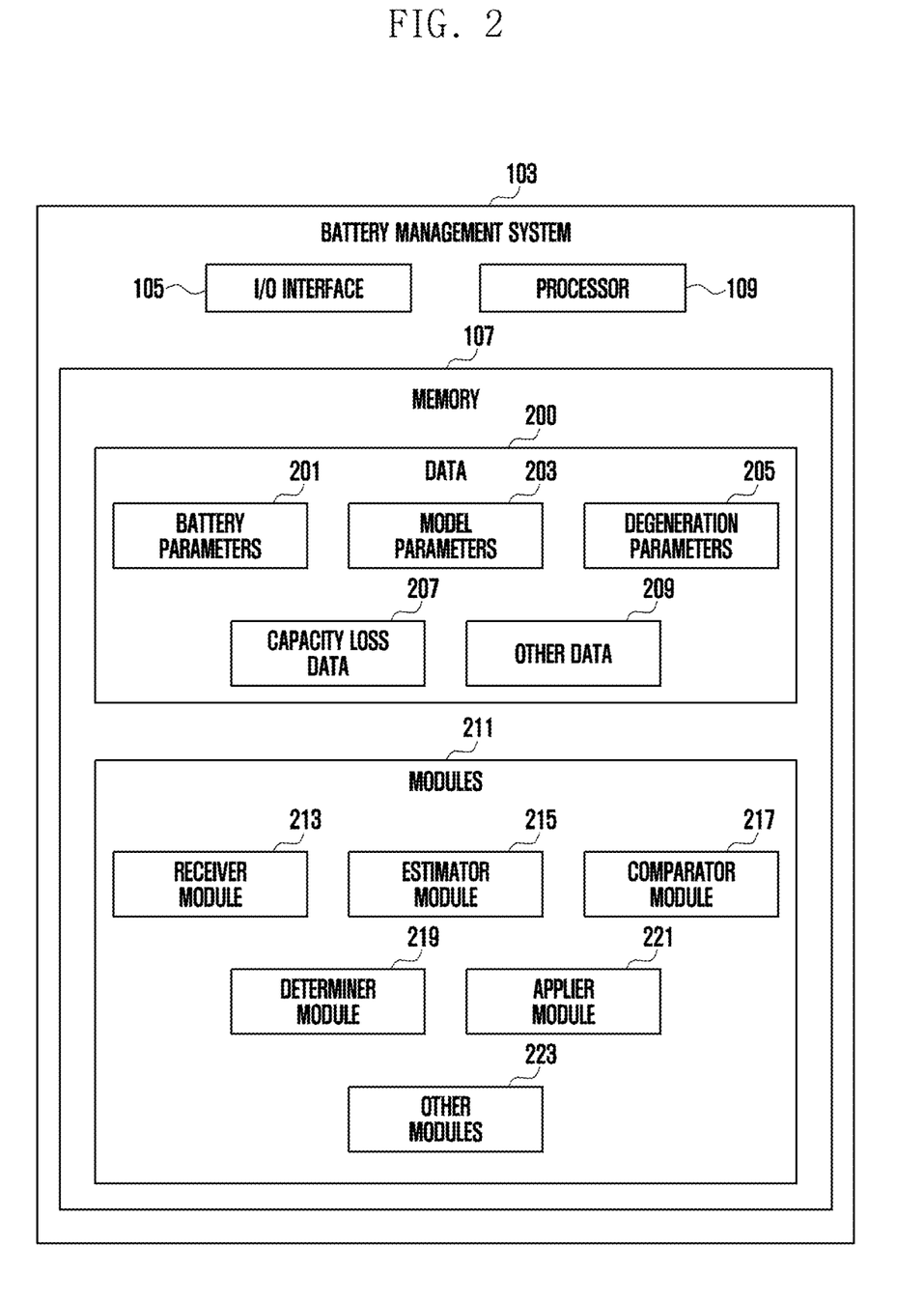
FIG. 2 illustrates a detailed block diagram of a battery management system in accordance with certain embodiments of the present disclosure.

FIG. 2 shows a detailed block diagram of a battery management system in accordance with some embodiments of the present disclosure.

The battery management system 103, in addition to the I/O interface 105 and the processor 109 described above, may include data 200 and one or more modules 211, which are described herein in detail. In the embodiment, the data 200 may be stored within the memory 107. The data 200 may include, for example, battery parameters 201, model parameters 203, degeneration parameters 205, capacity loss data 207 and other data 209.

The battery parameters 201 may include at least one of current, voltage, temperature of the rechargeable battery 101 during the charging of the rechargeable battery 101, and time taken for the charging of the rechargeable battery 101.

The model parameters 203 may include at least one of current and voltage. In an embodiment, the battery management system 103 may estimate the model parameters 203 of a battery using a mathematical model. In another embodiment, the battery management system 103 may pre-store the model parameters 203 in the memory 107 without the estimating.

The degeneration parameters 205 may include at least one of resistance of SEI layer, current of the SEI layer and voltage of the SEI layer of the rechargeable battery 101.

The capacity loss data 207 may include capacity loss data of the rechargeable battery 101.

The other data 209 may store data, including temporary data and temporary files, generated by modules 211 for performing various functions of the battery management system 103.

In an embodiment, the data 200 in the memory 107 are processed by the one or more modules 211 of the battery management system 103. In one embodiment, the one or more modules 211 may be implemented as dedicated hardware units. As used herein, the term module may refer to an Application Specific Integrated Circuit (ASIC), an electronic circuit, a Field-Programmable Gate Arrays (FPGA), Programmable System-on-Chip (PSoC), a combinational logic circuit, and/or other suitable components that provide the described functionality. In some implementations, the one or more modules 211 may be communicatively coupled to the processor 109 for performing one or more functions of the battery management system 103. The said modules 211 when configured with the functionality defined in the present disclosure may result in new or different hardware. In one embodiment more than one module of the modules 211 may be combined.

In one implementation, the one or more modules 211 may include, but are not limited to, a receiver module 213, an estimator module 215, a comparator module 217, a determiner module 219 and an applier module 221. The one or more modules 211 may also, include other modules 223 to perform various miscellaneous functionalities of the battery management system 103.

The receiver module 213 may receive a plurality of rechargeable battery 101 parameters. This process may occur in real-time, during charging activity of the rechargeable battery 101. Here, the rechargeable battery 101 parameters may comprise at least one of current, voltage, temperature of the rechargeable battery 101 during the charging of the rechargeable battery 101, and time taken for the charging of the rechargeable battery 101.

The estimator module 215 may perform two activities. First, the estimator module 215 may estimate model parameters of the rechargeable battery 101 using a mathematical model. The model parameters of the rechargeable battery 101 may comprise at least one of current and voltage. The mathematical model used may be a combination of a battery model with one of a Kalman filter, an Extended Kalman Filter (EKF), an Unscented Kalman Filter (UKF) and a particle filter.

A second activity of the estimator module 215 may be performed after the comparator module 217 compares battery capacity loss before and after applying a new charging current profile to the rechargeable battery 101. The estimator module 215 may use the comparison result to estimate remaining lifetime of the rechargeable battery 101.

The comparator module 217 may perform two activities. First, the comparator module 217 may compare between the estimated model parameters of the rechargeable battery 101 and the rechargeable battery 101 parameters received by the receiver module 213. The comparison step may be performed to determine degradation parameters of the rechargeable battery 101 in real-time. Here, the degradation parameters of the rechargeable battery 101 may comprise at least one of resistance of SEI, current of the SEI layer and voltage of the SEI layer.

A second activity performed by the comparator module 217 may be performed after the determiner module 219 determines a battery capacity loss. In the second activity, the comparator module 217 may compare the battery capacity loss determined by the determiner module 219 with a battery capacity loss obtained before applying the determined new charging current profile to the rechargeable battery 101.

The determiner module 219 may perform two activities. First, the determiner module 219 may determine a new charging current profile of the rechargeable battery 101. This determination step is performed based on the degradation parameters of the rechargeable battery 101 obtained from the comparator module 217 and using any one of a nonlinear constraint optimization algorithm, an Interior-point method or an augmented Lagrangian method. The nonlinear constraint optimization algorithm may be a Sequential Quadratic Programming (SQP) algorithm.

Second activity performed by the determiner module 219 may be performed after the applier module 221 applies new charging current profile. i.e., after the applier module 221 applies new charging current profile to the rechargeable battery 101, the determiner module 219 may determine a battery capacity loss based on the new charging current profile.

The applier module 221 may apply the new charging current profile obtained from the determiner module 219 to the rechargeable battery 101 for improving SoH of the rechargeable battery 101.

Figure 3:
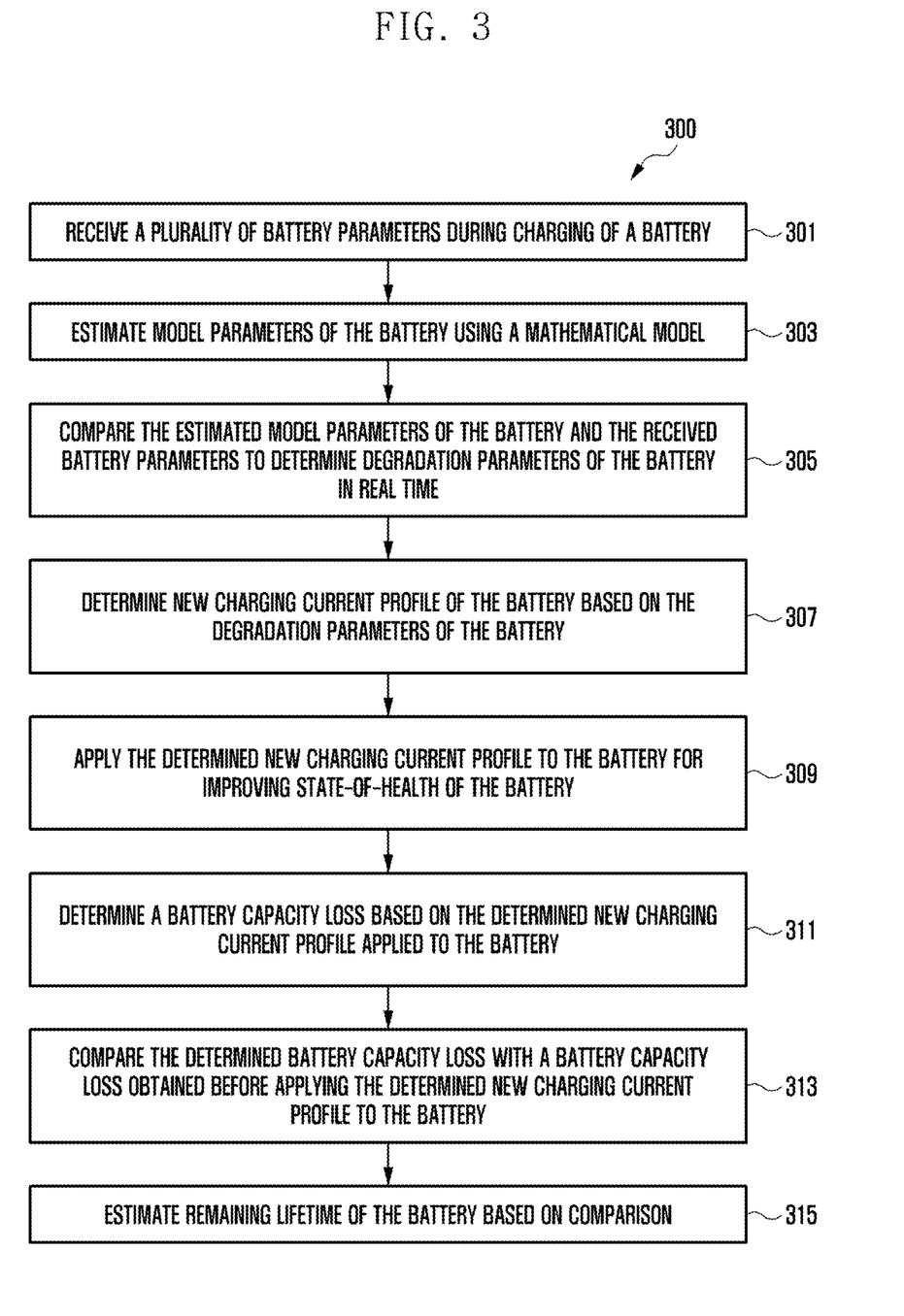
FIG. 3 illustrates a flowchart showing a method for improving State of Health of rechargeable batteries in accordance with certain embodiments of the present disclosure.

FIG. 3 illustrates a flowchart showing a method for improving SoH of rechargeable batteries in accordance with some embodiments of the present disclosure.

As illustrated in FIG. 3, the method 300 includes one or more blocks for improving SoH of rechargeable batteries. The method 300 may be described in the general context of computer executable instructions. Generally, computer executable instructions can include routines, programs, objects, components, data structures, procedures, modules, and functions, that perform various procedures.

The order in which the method 300 is described is not intended to be construed as a limitation, and any number of the described method blocks can be combined in any order to implement the method. Additionally, individual blocks may be deleted from the methods without departing from the scope of the subject matter described herein. Furthermore, the method can be implemented in any suitable hardware, software, firmware, or combination thereof.

At block 301, the receiver module 213 may receive a plurality of battery parameters during charging of a battery. The receiver module 213 of the battery management system 103 may receive the plurality of battery parameters from the battery itself. Here, the battery parameters comprise at least one of current, voltage, temperature of the battery during the charging of the battery, and time taken for the charging of the battery. The battery parameters are measured by sensors present on a device to which the battery is attached.

At block 303, the estimator module 215 may estimate model parameters of the battery using a mathematical model. The mathematical model used to estimate the model parameters may be a combination of a battery model with one of Kalman filter, an Extended Kalman Filter (EKF), an Unscented Kalman Filter (UKF), and a particle filter. The model parameters of the battery may comprise at least one of current and voltage.

At block 305, the comparator module 217 may compare the estimated model parameters of the battery from the block 303 and the received battery parameters from the block 301 to determine degradation parameters of the battery in real time. The degradation parameters of the battery may comprise at least one of resistance of SEI layer ($R_{sei}$), current of the SEI layer ($I_{sei}$) and voltage of the SEI layer ($V_{sei}$).

For instance, at blocks 303 and 305, the algorithm used for the estimation may be EKF and states, which are four degradation states (i.s., side reaction exchange current ($I_{osei}$), side reaction equilibrium potential ($U_{osei}$), scaling constant used to account for magnitude differences between cell level and electrode potential ($C_A$), and Rsei). Error minimization is done using the voltage measured at block 301 and model voltage predicted at block 303. Input to the EKF filter is the current supplied at block 301.

At block 307, the determiner module 219 may determine new charging current profile of the battery based on the degradation parameters of the battery from the block 305. The new charging current profile of the battery may be determined using a nonlinear constraint optimization algorithm, an interior-point method or an augmented Lagrangian method. The nonlinear constraint optimization algorithm may be a sequential quadratic Programming (SQP) algorithm.

For instance, at block 307, after applying EKF and obtaining the four degradation parameters (states) at blocks 303 and 305, $I_{sei}$ is calculated using the formula mentioned below:

$$I_{sei} = I_{0,sei} \exp\left(-\frac{a_n F}{C_A R_g T}[U_o - U_{sei}^1] + \sinh^{-1}\left(\frac{I}{2I_{o,a}}\right)\right)$$

Here, F is a Faraday constant, $R_g$ is a Universal gas constant, $\alpha$ is a charge transfer coefficient, T is Temperature and $I_{oa}$ is a normalization constant for charge transfer reaction.

At block 309, the applier module 221 may apply the determined new charging current profile from the block 307 to the battery for improving SoH of the battery.

At block 311, the determiner module 219 may determine a battery capacity loss based on the determined new charging current profile from the block 309 applied to the battery.

For instance, at block 311, $Q^{Est}_{loss}$ is calculated using $I_{sei}$ obtained at block 307 and using the formula mentioned below:

$$Q_{Loss} = \int_{t}^{t_{max}} I_{sei} dt$$

At block 313, the comparator module 217 may compare the determined battery capacity loss from the block 311 with a battery capacity loss ($Q^{Opt}_{loss}$) obtained before applying the determined new charging current profile to the battery. $Q^{Opt}_{loss}$ is calculated in a similar way using the formula mentioned in block 311 but using charging current at the time of charging of the battery at block 301.

At block 315, the estimator module 225 may estimate remaining lifetime of the battery based on comparison from the block 313.

Some advantages of the present disclosure are listed below.

The present disclosure improves SoH estimation of rechargeable batteries. The estimation of SOH provides the useable battery capacity, which is a measure of capacity retention power of a battery and is, also, useful for accurate State of Charge (SoC) estimation of the battery.

The present disclosure helps in avoiding or mitigating battery runtime failures. Due to improved SoH estimation, the battery life gets extended. As a result, the battery is useable for a longer time period before scheduling any replacement. This may be essential to avoid runtime failures in EV and aerospace applications.

The present disclosure may help minimize battery capacity loss. Due to repeated usage over time, the battery may experience gradual decrease in its deliverable capacity. Therefore, the useable capacity should be maximized by minimizing the loss while in operation, which may be done by improving the battery SoH.

The present disclosure may help in increasing battery reliability. Li-ion batteries are not useable further if the SoH level falls below a predefined threshold limit. Hence, a suitable SoH estimation is necessary to increase the safety, efficiency and reliability of Li-ion batteries and the host devices, which is achieved using present method.

Computing System

Figure 4:
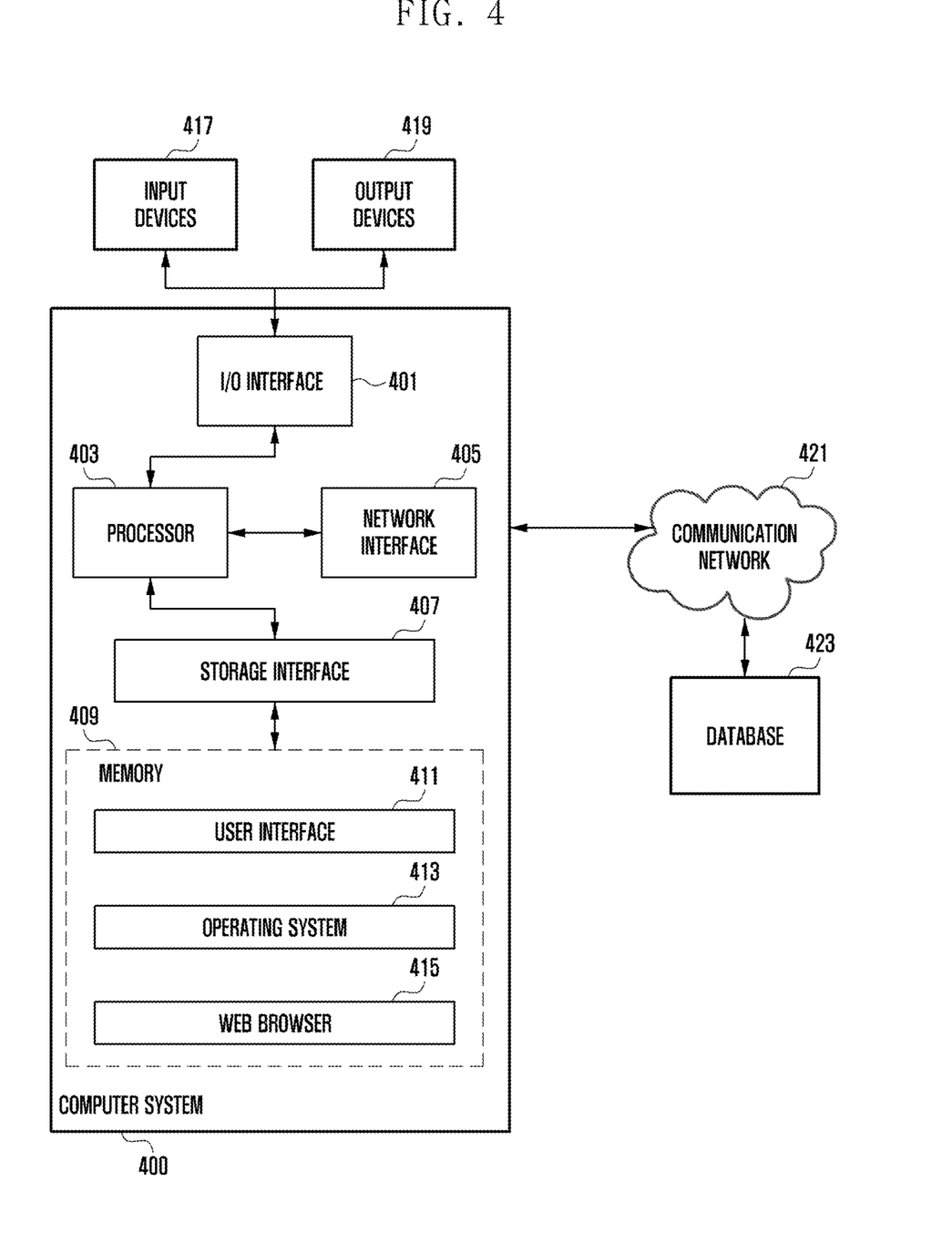
FIG. 4 illustrates a block diagram of an exemplary computer system for implementing certain embodiments consistent with the present disclosure.

FIG. 4 illustrates a block diagram of an exemplary computer system 400 for implementing embodiments consistent with the present disclosure. In an embodiment, the computer system 400 may be used to implement the battery management system 103. The computer system 400 may include a central processing unit ("CPU" or "processor") 403. The processor 403 may include at least one data processor for improving SoH of rechargeable batteries. The processor 403 may include specialized processing units such as, integrated system (bus) controllers, memory management control units, floating point units, graphics processing units, digital signal processing units, etc.

The processor 403 may be disposed in communication with one or more input/output (I/O) devices (not shown) via I/O interface 401. The I/O interface 401 employ communication protocols/methods such as, without limitation, audio, analog, digital, monoaural, Radio Corporation of America (RCA) connector, stereo, IEEE-1394 high speed serial bus, serial bus, Universal Serial Bus (USB), infrared, Personal System/2 (PS/2) port, Bayonet Neill-Concelman (BNC) connector, coaxial, component, composite, Digital Visual Interface (DVI), High-Definition Multimedia Interface (HDMI), Radio Frequency (RF) antennas, S-Video, Video Graphics Array (VGA), IEEE 802.11b/g/n/x, Bluetooth, cellular e.g., Code-Division Multiple Access (CDMA), High-Speed Packet Access (HSPA+), Global System for Mobile communications (GSM), Long-Term Evolution (LTE), Worldwide interoperability for Microwave access (WiMax), or the like, etc Using the I/O interface 401, the computer system 400 may communicate with one or more I/O devices such as input devices 417 and output devices 419. For example, the input devices 417 may be an antenna, keyboard, mouse, joystick, (infrared) remote control, camera, card reader, fax machine, dongle, biometric reader, microphone, touch screen, touchpad, trackball, stylus, scanner, storage device, transceiver, video device/source, etc. The output devices 419 may be a printer, fax machine, video display (e.g., Cathode Ray Tube (CRT), Liquid Crystal Display (LCD), Light-Emitting Diode (LED), plasma, Plasma Display Panel (PDP), Organic Light-Emitting Diode display (OLED) or the like), audio speaker, etc.

In some embodiments, the computer system 400 consists of the battery management system 103. The processor 403 may be disposed in communication with the communication network 421 via a network interface 405. The network interface 405 may communicate with the communication network 421. The network interface 405 may employ connection protocols including, without limitation, direct connect, Ethernet (e.g., twisted pair 10/100/1000 Base T), Transmission Control Protocol/Internet Protocol (TCP/IP), token ring, IEEE 802.11a/b/g/n/x, etc. The communication network 421 may include, without limitation, a direct interconnection, Local Area Network (LAN), Wide Area Network (WAN), wireless network (e.g., using Wireless Application Protocol), the Internet, etc. Using the network interface 405 and the communication network 421, the computer system 400 may communicate with a database 423. The network interface 405 may employ connection protocols include, but not limited to, direct connect, Ethernet (e.g., twisted pair 10/100/1000 Base T), TCP/IP, token ring, IEEE 802.11a/b/g/n/x, etc.

The communication network 421 may include, but is not limited to, a direct interconnection, a Peer to Peer (P2P) network, Local Area Network (LAN), Wide Area Network (WAN), wireless network (e.g., using Wireless Application Protocol), the Internet, Wi-Fi and such. The first network and the second network may either be a dedicated network or a shared network, which represents an association of the different types of networks that use a variety of protocols, for example, Hypertext Transfer Protocol (HTTP), TCP/IP, Wireless Application Protocol (WAP), etc., to communicate with each other. Further, the first network and the second network may include a variety of network devices, including routers, bridges, servers, computing devices, storage devices, etc.

In some embodiments, the processor 403 may be disposed in communication with a memory 409 (e.g., RAM, ROM, etc. not shown in FIG. 4) via a storage interface 407. The storage interface 407 may connect to memory 409 including, without limitation, memory drives, removable disc drives, etc., employing connection protocols such as, Serial Advanced Technology Attachment (SATA), Integrated Drive Electronics (IDE), IEEE-1394, USB, fiber channel, Small Computer Systems Interface (SCSI), etc. The memory drives may further include a drum, magnetic disc drive, magneto-optical drive, optical drive, Redundant Array of Independent Discs (RAID), solid-state memory devices, solid-state drives, etc.

The memory 409 may store a collection of program or database components, including, without limitation, user interface 411, an operating system 413, etc. In some embodiments, computer system 400 may store user/application data, such as, the data, variables, records, etc., as described in this disclosure. For example, the computer system 400 may store user/application data in one or more databases. The database(s) may be implemented as fault-tolerant, relational, scalable, and secure databases such as Oracle or Sybase.

The operating system 413 may facilitate resource management and operation of the computer system 400. Examples of operating systems include, without limitation, APPLE® MACINTOSH® OS X®, UNIX®, UNIX-like system distributions (E.G., BERKELEY SOFTWARE DISTRIBUTION® (BSD), FREEBSD®, NETBSD®, OPENBSD, etc.), LINUX® DISTRIBUTIONS (E.G., RED HAT®, UBUNTU®, KUBUNTU®, etc.), IBM®OS/2®, MICROSOFT® WINDOWS® (XP®, VISTA®/7/8, 10 etc.), APPLE® IOS®, GOOGLE™ ANDROID™, BLACKBERRY® OS, or the like.

In some embodiments, the computer system 400 may implement web browser 415 stored program components. Web browser 415 may be a hypertext viewing application, such as MICROSOFT® INTERNET EXPLORER®, GOOGLE™ CHROME™, MOZILLA® FIREFOX®, APPLE® SAFARI®, etc. Secure web browsing may be provided using Secure Hypertext Transport Protocol (HTTPS), Secure Sockets Layer (SSL), Transport Layer Security (TLS), etc. Web browsers 415 may utilize facilities such as AJAX, DHTML, ADOBE® FLASH®, JAVASCRIPT®, JAVA®, Application Programming Interfaces (APIs), etc. Computer system 400 may implement a mail server (not shown in FIG. 4) stored program component. The mail server may be an Internet mail server such as Microsoft Exchange, or the like. The mail server may utilize facilities such as ASP, ACTIVEX®, ANSI® C++/C#, MICROSOFT®, .NET, CGI SCRIPTS, JAVA®, JAVASCRIPT®, PERL®, PHP, PYTHON®, WEBOBJECTS®, etc. The mail server may utilize communication protocols such as Internet Message Access Protocol (IMAP), Messaging Application Programming Interface (MAPI), MICROSOFT® exchange, Post Office Protocol (POP), Simple Mail Transfer Protocol (SMTP), or the like. Computer system 400 may implement a mail client (not shown in FIG. 4) stored program component. The mail client may be a mail viewing application, such as APPLE® MAIL, MICROSOFT® ENTOURAGE®, MICROSOFT® OUTLOOK®, MOZILLA® THUNDERBIRD®, etc.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory.

Examples include Random Access Memory (RAM), Read-Only Memory (ROM), volatile memory, non-volatile memory, hard drives, CD ROMs, DVDs, flash drives, disks, and any other known physical storage media.

The described operations may be implemented as a method, system or article of manufacture using standard programming and/or engineering techniques to produce software, firmware, hardware, or any combination thereof. The described operations may be implemented as code maintained in a "non-transitory computer readable medium", where a processor may read and execute the code from the computer readable medium. The processor is at least one of a microprocessor and a processor capable of processing and executing the queries. A non-transitory computer readable medium may include media such as magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), etc. Further, non-transitory computer-readable media include all computer-readable media except for a transitory. The code implementing the described operations may further be implemented in hardware logic (e.g., an integrated circuit chip, Programmable Gate Array (PGA), Application Specific Integrated Circuit (ASIC), etc.).

The terms "an embodiment", "embodiment", "embodiments", "the embodiment", "the embodiments", "one or more embodiments", "some embodiments", and "one embodiment" mean "one or more (but not all) embodiments according to this disclosure" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

A description of an embodiment with several components in communication with each other does not imply that all such components are required. On the contrary, a variety of optional components are described to illustrate the wide variety of possible embodiments according to this disclosure.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments in accordance with this disclosure need not include the device itself.

The illustrated operations of FIG. 3 shows certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

Finally, the language used in the specification has been principally selected for readability and instructional purposes, and it may not have been selected to delineate or circumscribe the disclosed subject matter. It is therefore intended that the scope of this disclosure be limited not by this detailed description, but rather by any claims that issue on an application based here on. Accordingly, the disclosure of the embodiments herein is intended to be illustrative, but not limiting, of the scope of this disclosure, which is set forth in the following claims.

Although the present disclosure has been described with various embodiments, various changes and modifications may be suggested to one skilled in the art. It is intended that the present disclosure encompass such changes and modifications as fall within the scope of the appended claims.

What is claimed is:

1. A method of improving state of health (SoH) of rechargeable batteries, the method comprising:
   obtaining, by a battery management system, a first battery capacity loss based on data stored in memory;
   receiving, by a battery management system, a plurality of battery parameters from a battery operatively connected with the battery management system during charging of the battery;
   determining, by the battery management system, degradation parameters of the battery by comparing model parameters of the battery and the received battery parameters;
   determining, by the battery management system, new charging current profile of the battery based on the degradation parameters of the battery;
   applying, by the battery management system, the determined new charging current profile to the battery;
   determining, by the battery management system, a second battery capacity loss based on the determined new charging current profile applied to the battery;
   comparing, by the battery management system, the determined second battery capacity loss with the first battery capacity loss obtained before applying the determined new charging current profile to the battery; and
   calculating, by the battery management system, a remaining lifetime of the battery based on the comparison of the first battery capacity loss and the second battery capacity loss.

2. The method as claimed in claim 1, wherein the battery parameters comprise at least one of current, voltage, temperature of the battery during the charging of the battery, and time taken for the charging of the battery.

3. The method as claimed in claim 1, wherein the model parameters of the battery comprise at least one of current and voltage.

4. The method as claimed in claim 1, wherein the degradation parameters of the battery comprise at least one of resistance of solid electrolyte interface layer, current of a solid electrolyte interface layer and voltage of a solid electrolyte interface layer.

5. The method as claimed in claim 1, wherein determining the new charging current profile of the battery is performed using a nonlinear constraint optimization algorithm.

6. The method as claimed in claim 1, wherein comparing the model parameters of the battery and the obtained battery parameters is performed in real time.

7. The method as claimed in claim 1, further comprising:
   estimating, by the battery management system, the model parameters of the battery using a mathematical model.

8. The method as claimed in claim 7, wherein the mathematical model is a combination of a battery model with one of an extended Kalman filter (EKF), an unscented Kalman filter (UKF), and a particle filter.

9. The method as claimed in claim 1, wherein the model parameters being pre-stored in the battery management system.

10. A battery management system for improving state of health (SoH) of rechargeable batteries, the system comprising:
a processor; and
memory communicatively coupled to the processor, wherein the memory stores processor-executable instructions that when executed, cause the processor to:
obtain a first battery capacity loss based on data stored in the memory;
receive a plurality of battery parameters from a battery operatively connected with the battery management system during charging of the battery;
determine degradation parameters of the battery by comparing model parameters of the battery and the received battery parameters;
determine new charging current profile of the battery based on the degradation parameters of the battery;
apply the determined new charging current profile to the battery;
determine a second battery capacity loss based on the determined new charging current profile applied to the battery;
compare the determined second battery capacity loss with the first battery capacity loss obtained before applying the determined new charging current profile to the battery; and
calculate a remaining lifetime of the battery based on the comparison of the first battery capacity loss and the second battery capacity loss.

11. The battery management system as claimed in claim 10, wherein the battery parameters comprise at least one of current, voltage, temperature of the battery during the charging of the battery, and time taken for the charging of the battery.

12. The battery management system as claimed in claim 10, wherein the model parameters of the battery comprise at least one of current and voltage.

13. The battery management system as claimed in claim 10, wherein the degradation parameters of the battery comprise at least one of resistance of solid electrolyte interface layer, current of a solid electrolyte interface layer and voltage of a solid electrolyte interface layer.

14. The battery management system as claimed in claim 10, wherein determining the new charging current profile of the battery is performed using a nonlinear constraint optimization algorithm.

15. The battery management system as claimed in claim 10, wherein comparing the model parameters of the battery and the obtained battery parameters is performed in real time.

16. The battery management system as claimed in claim 10, wherein the system causes the processor to:
estimate the model parameters of the battery using a mathematical model.

17. The battery management system as claimed in claim 10, wherein the model parameters being pre-stored in memory.

18. A device comprising:
a battery management system for improving state of health (SoH) of rechargeable batteries; and
a battery connected to the battery management system, wherein the battery management system comprises:
memory; and
a processor coupled to the memory and configured to:
obtain a first battery capacity loss based on data stored in the memory;
receive a plurality of battery parameters from the battery during charging of the battery;
determine degradation parameters of the battery by comparing model parameters of the battery and the received battery parameters;
determine new charging current profile of the battery based on the degradation parameters of the battery;
apply the determined new charging current profile to the battery;
determine a second battery capacity loss based on the determined new charging current profile applied to the battery;
compare the determined second battery capacity loss with the first battery capacity loss obtained before applying the determined new charging current profile to the battery; and
calculate a remaining lifetime of the battery based on the comparison of the first battery capacity loss and the second battery capacity loss.

* * * * *